United States Patent
Kawata

(10) Patent No.: US 12,342,658 B2
(45) Date of Patent: Jun. 24, 2025

(54) METHOD FOR MANUFACTURING LIGHT-EMITTING ELEMENT

(71) Applicant: NICHIA CORPORATION, Anan (JP)

(72) Inventor: Yoshitaka Kawata, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 519 days.

(21) Appl. No.: 17/880,252

(22) Filed: Aug. 3, 2022

(65) Prior Publication Data

US 2023/0083461 A1 Mar. 16, 2023

(30) Foreign Application Priority Data

Sep. 10, 2021 (JP) .................. 2021-147942

(51) Int. Cl.
H10H 20/01 (2025.01)
H01L 21/67 (2006.01)

(52) U.S. Cl.
CPC ... *H10H 20/0137* (2025.01); *H01L 21/67248* (2013.01); *H01L 21/67253* (2013.01); *H10H 20/01* (2025.01)

(58) Field of Classification Search
None
See application file for complete search history.

(56) References Cited

U.S. PATENT DOCUMENTS

| | | | |
|---|---|---|---|
| 10,763,333 B2* | 9/2020 | Tomita | H01L 21/0254 |
| 2002/0047135 A1* | 4/2002 | Nikolaev | C30B 29/40 |
| | | | 257/E31.02 |
| 2008/0118999 A1 | 5/2008 | Komada | |
| 2011/0272719 A1* | 11/2011 | Chen | H10H 20/816 |
| | | | 257/94 |
| 2015/0060877 A1* | 3/2015 | Liu | H10H 20/813 |
| | | | 257/76 |
| 2019/0140134 A1* | 5/2019 | Mann | H10H 20/811 |
| 2021/0202790 A1* | 7/2021 | Hayashi | H10H 20/0137 |
| 2021/0305451 A1* | 9/2021 | Kishino | H10H 20/01335 |
| 2023/0051845 A1* | 2/2023 | Zollner | H10H 29/14 |
| 2023/0197890 A1* | 6/2023 | Funakoshi | H10H 20/812 |
| | | | 257/13 |

FOREIGN PATENT DOCUMENTS

| | | |
|---|---|---|
| JP | 2008-130877 A | 6/2008 |
| JP | 2017-157667 A | 9/2017 |
| JP | 2019-087709 A | 6/2019 |
| JP | 2021-502713 A | 1/2021 |
| JP | 2021-158291 A | 10/2021 |

* cited by examiner

*Primary Examiner* — Alexander G Ghyka
(74) *Attorney, Agent, or Firm* — Foley & Lardner LLP

(57) ABSTRACT

The forming of the tunnel junction layer includes forming a first n-type layer, forming a second n-type layer by introducing a first raw material gas into a furnace at a first temperature, the first raw material gas including a first gas having a first flow rate, and forming a third n-type layer by introducing a second raw material gas into a furnace at a second temperature, the second raw material gas including a second gas having a second flow rate, the second temperature being less than the first temperature. A first flow rate ratio of the first gas in the first raw material gas is greater than a second flow rate ratio of the second gas in the second raw material gas.

20 Claims, 13 Drawing Sheets

METHOD FOR MANUFACTURING LIGHT-EMITTING ELEMENT

CROSS-REFERENCE TO RELATED APPLICATION

This application claims priority to Japanese Patent Application No. 2021-147942, filed on Sep. 10, 2021, the disclosure of which is hereby incorporated by reference in its entirety.

BACKGROUND

The present invention relates to a method for manufacturing a light-emitting element.

For example, JP-A 2017-157667 discusses a light-emitting element including a nitride semiconductor layer that includes a tunnel junction layer.

SUMMARY

It is desirable to reduce the forward voltage of such a light-emitting element. Embodiments of the invention are directed to a method for manufacturing a light-emitting element that can reduce the forward voltage.

According to one embodiment of the present invention, a method for manufacturing a light-emitting element includes forming a first nitride semiconductor layer including an n-type impurity; forming a first active layer on the first nitride semiconductor layer; forming a second nitride semiconductor layer on the first active layer, the second nitride semiconductor layer including a p-type impurity; forming a tunnel junction layer on the second nitride semiconductor layer, the tunnel junction layer including a nitride semiconductor layer; forming a third nitride semiconductor layer on the tunnel junction layer, the third nitride semiconductor layer including an n-type impurity; forming a second active layer on the third nitride semiconductor layer; and forming a fourth nitride semiconductor layer on the second active layer, the fourth nitride semiconductor layer including a p-type impurity. The forming of the tunnel junction layer includes forming a first n-type layer, forming a second n-type layer on the first n-type layer by introducing a first raw material gas into a furnace at a first temperature, the first raw material gas including a first gas that includes an n-type impurity and has a first flow rate, the second n-type layer having a lower n-type impurity concentration than the first n-type layer, and forming a third n-type layer on the second n-type layer by introducing a second raw material gas into a furnace at a second temperature, the second raw material gas including a second gas that includes an n-type impurity and has a second flow rate, the second temperature being less than the first temperature, the third n-type layer having a lower n-type impurity concentration than the second n-type layer. A first flow rate ratio of the first gas in the first raw material gas is greater than a second flow rate ratio of the second gas in the second raw material gas. A thickness of the second n-type layer is greater than a thickness of the third n-type layer.

According to another embodiment of the present invention, a method for manufacturing a light-emitting element includes forming a first nitride semiconductor layer including an n-type impurity; forming a first active layer on the first nitride semiconductor layer; forming a second nitride semiconductor layer on the first active layer, the second nitride semiconductor layer including a p-type impurity; forming a tunnel junction layer on the second nitride semiconductor layer, the tunnel junction layer including a nitride semiconductor layer; forming a third nitride semiconductor layer on the tunnel junction layer, the third nitride semiconductor layer including an n-type impurity; forming a second active layer on the third nitride semiconductor layer; and forming a fourth nitride semiconductor layer on the second active layer, the fourth nitride semiconductor layer including a p-type impurity. The forming of the tunnel junction layer includes forming a first n-type layer, forming a second n-type layer on the first n-type layer by introducing a first raw material gas into a furnace at a first temperature, the first raw material gas including a first gas that includes an n-type impurity and has a first flow rate, the second n-type layer having a lower n-type impurity concentration than the first n-type layer, and forming a third n-type layer on the second n-type layer by introducing a second raw material gas into a furnace at a second temperature, the second raw material gas including a second gas that includes an n-type impurity and has a second flow rate, the second temperature being less than the first temperature, the third n-type layer having a lower n-type impurity concentration than the second n-type layer. A first flow rate ratio of the first gas in the first raw material gas is greater than a second flow rate ratio of the second gas in the second raw material gas. A sum of a thickness of the second n-type layer and a thickness of the third n-type layer is not more than 50 nm. The thickness of the third n-type layer is not less than 40% and not more than 80% of the sum of the thickness of the second n-type layer and the thickness of the third n-type layer. A difference between the first temperature and the second temperature is not more than 100° C.

The present disclosure can provide a method for manufacturing a light-emitting element that can reduce the forward voltage.

DETAILED DESCRIPTION

Figure 1:
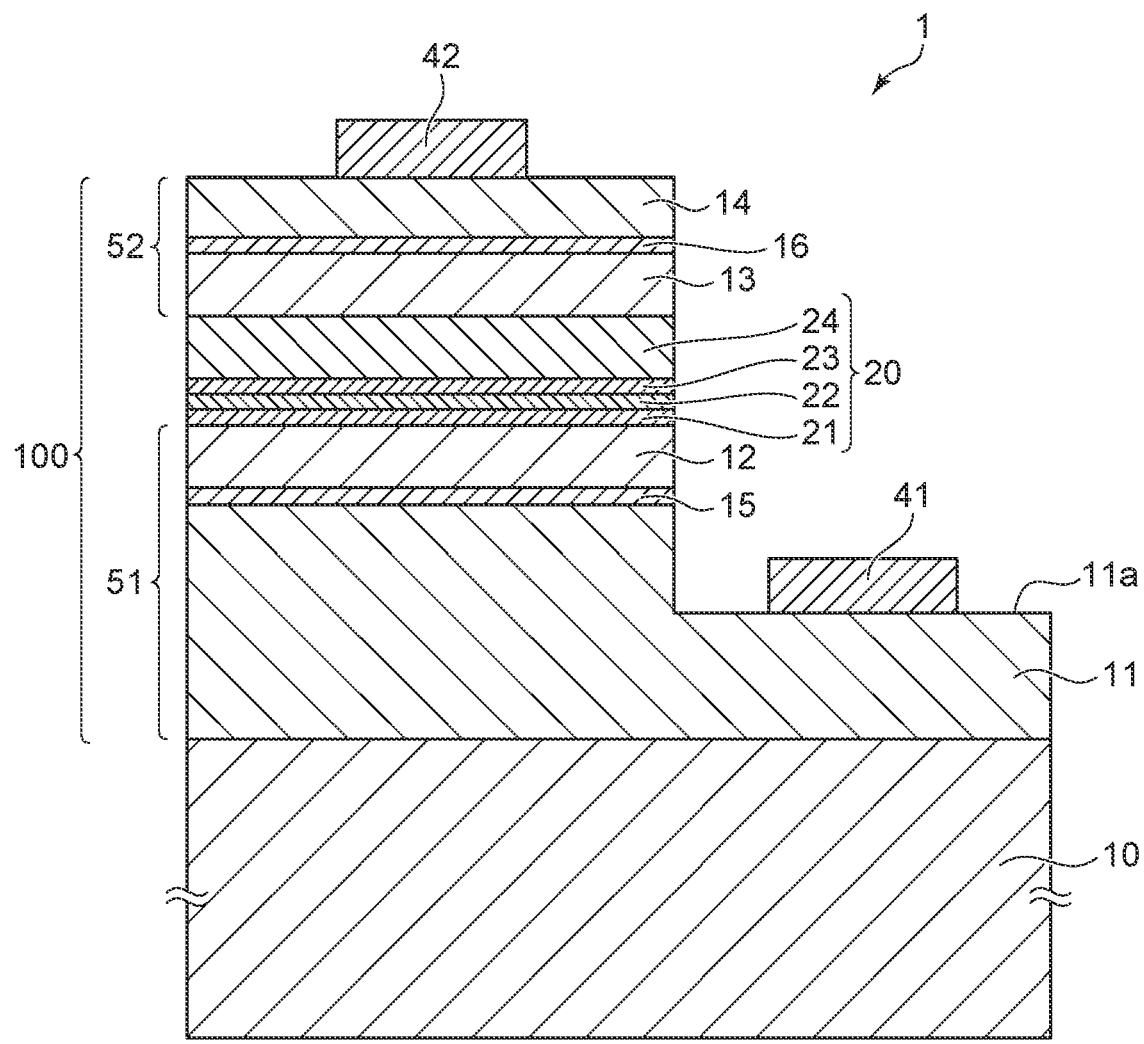
FIG. 1 is a schematic cross-sectional view of a light-emitting element of an embodiment of the present disclosure.

Exemplary embodiments will now be described with reference to the drawings. Similar components in the drawings are marked with like reference numerals. The drawings schematically show embodiments. The scales, spacing, positional relationships, and the like of the members may be exaggerated, or some of the members may not be illustrated.

FIG. 1 is a schematic cross-sectional view of a light-emitting element 1 of an embodiment of the present disclosure.

The light-emitting element 1 includes a substrate 10, a semiconductor structure body 100, an n-side electrode 41, and a p-side electrode 42.

The material of the substrate 10 is, for example, sapphire, silicon, SiC, GaN, etc.

The semiconductor structure body 100 is a stacked body in which multiple semiconductor layers made of a nitride semiconductor are stacked. The nitride semiconductor may include all compositions of semiconductors of the chemical formula $In_xAl_yGa_{1-x-y}N$ ($0 \le x \le 1$, $0 \le y \le 1$, and $x+y \le 1$) for which the composition ratios x and y are changed within the ranges respectively.

The semiconductor structure body 100 includes a first light-emitting part 51, a second light-emitting part 52, and a tunnel junction layer 20 located between the first light-emitting part 51 and the second light-emitting part 52.

The first light-emitting part 51 includes a first nitride semiconductor layer 11 located on the substrate 10, a first active layer 15 located on the first nitride semiconductor layer 11, and a second nitride semiconductor layer 12 located on the first active layer 15.

The second light-emitting part 52 includes a third nitride semiconductor layer 13 located on the tunnel junction layer 20, a second active layer 16 located on the third nitride semiconductor layer 13, and a fourth nitride semiconductor layer 14 located on the second active layer 16.

The first nitride semiconductor layer 11 and the third nitride semiconductor layer 13 include n-type layers that include an n-type impurity. The n-type layers are, for example, GaN that includes silicon (Si) as the n-type impurity. Or, the n-type layers may include germanium (Ge) as the n-type impurity. Also, the n-type layers may include indium (In) and/or aluminum (Al). The first nitride semiconductor layer 11 and the third nitride semiconductor layer 13 each may include a superlattice layer having a stacked structure in which multiple semiconductor layers made of different materials are stacked. For example, the superlattice layer has a stacked structure in which a layer made of GaN and a layer made of InGaN are alternately stacked.

It is sufficient for the first and third nitride semiconductor layers 11 and 13 to have the function of supplying electrons; the first nitride semiconductor layer 11 and the third nitride semiconductor layer 13 may include undoped layers formed without intentionally doping an n-type impurity and/or a p-type impurity. When an undoped layer is adjacent to a layer intentionally doped with an n-type impurity and/or a p-type impurity, the n-type impurity and/or the p-type impurity may be included in the undoped layer due to diffusing from the adjacent layer, etc.

The second nitride semiconductor layer 12 and the fourth nitride semiconductor layer 14 include p-type layers including a p-type impurity. The p-type layers are, for example, GaN including magnesium (Mg) as the p-type impurity. The p-type layers may include In and/or Al. It is sufficient for the second and fourth nitride semiconductor layers 12 and 14 to have the function of supplying holes; the second nitride semiconductor layer 12 and the fourth nitride semiconductor layer 14 may include undoped layers.

For example, the first active layer 15 and the second active layer 16 each have a multi-quantum well structure including multiple well layers and multiple barrier layers. For example, InGaN and AlGaN can be used as the multiple well layers. For example, GaN and AlGaN can be used as the multiple barrier layers. The well layers and the barrier layers that are included in the first and second active layers 15 and 16 are, for example, undoped layers. At least a portion of the well layers and the barrier layers included in the first and second active layers 15 and 16 may include an n-type impurity and/or a p-type impurity.

For example, the first active layer 15 and the second active layer 16 emit ultraviolet light or visible light. For example, the first active layer 15 and the second active layer 16 can emit blue light or green light as visible light. The light emission peak wavelength of blue light is not less than 430 nm and not more than 490 nm. The light emission peak wavelength of green light is not less than 500 nm and not more than 540 nm. The light emission peak wavelength of ultraviolet light is not more than 400 nm. The light emission peak wavelength of the first active layer 15 and the light emission peak wavelength of the second active layer 16 may be the same or different from each other. When the light emission peak wavelength of the first active layer 15 and the light emission peak wavelength of the second active layer 16 are different from each other, a combination can be used in which one of the first active layer 15 or the second active layer 16 emits blue light, and the other emits green light.

The tunnel junction layer 20 is made of a nitride semiconductor. The tunnel junction layer 20 includes a first n-type layer 21 located on the second nitride semiconductor layer 12, a second n-type layer 22 located on the first n-type layer 21, a third n-type layer 23 located on the second n-type layer 22, and a fourth n-type layer 24 located on the third n-type layer 23. The second nitride semiconductor layer 12 includes a p-type layer in the uppermost layer of the second nitride semiconductor layer 12. This p-type layer of the second nitride semiconductor layer 12 and the first n-type layer 21 of the tunnel junction layer 20 form a p-n junction. The fourth n-type layer 24 may not be included.

The first nitride semiconductor layer 11 includes an n-contact surface 11a on which other semiconductor layers are not provided. The n-side electrode 41 is located on the n-contact surface 11a. The n-side electrode 41 is electrically connected to the first nitride semiconductor layer 11.

The p-side electrode 42 is located on the upper surface of the fourth nitride semiconductor layer 14. The p-side electrode 42 is electrically connected to the fourth nitride semiconductor layer 14. A forward voltage is applied between the p-side electrode 42 and the n-side electrode 41. At this time, the forward voltage is applied between the fourth nitride semiconductor layer 14 of the second light-emitting part 52 and the first nitride semiconductor layer 11 of the first light-emitting part 51; the first active layer 15 and the second active layer 16 emit light due to the holes and electrons supplied to the first and second active layers 15 and 16.

According to the light-emitting element 1 of the embodiment, by stacking the second active layer 16 on the first active layer 15, the output per unit area can be greater than that of a light-emitting element that includes one active layer.

When the potential applied to the n-side electrode 41 is less than the potential of the p-side electrode 42, a reverse voltage is applied between the third nitride semiconductor layer 13 of the second light-emitting part 52 including the n-type layer and the second nitride semiconductor layer 12 of the first light-emitting part 51 including the p-type layer. Therefore, a tunnel effect due to the tunnel junction layer 20 is utilized to cause a current to flow between the third nitride semiconductor layer 13 and the second nitride semiconductor layer 12. That is, by setting the impurity concentration of the p-n junction described above to be high, the width of the depletion layer formed by the p-n junction is narrowed, and a current is caused to flow by electrons existing in the valence band of the second nitride semiconductor layer 12 tunneling to the conduction band of the third nitride semiconductor layer 13.

An example of a method for manufacturing the light-emitting element 1 of the embodiment will now be described.

The nitride semiconductor layers of the semiconductor structure body 100 are formed by, for example, MOCVD (metal organic chemical vapor deposition) in a furnace having adjustable pressure and temperature. The nitride semiconductor layers of the semiconductor structure body 100 are epitaxially grown on the substrate 10 in the furnace.

The nitride semiconductor layers of the semiconductor structure body 100 can be formed by introducing a carrier gas and a raw material gas to the furnace. Hydrogen ($H_2$) gas and/or nitrogen ($N_2$) gas can be used as the carrier gas. Ammonia ($NH_3$) gas can be used as the N source raw material gas. Trimethylgallium (TMG) gas or triethylgallium (TEG) gas can be used as the Ga source raw material gas. Trimethylindium (TMI) gas can be used as the In source raw material gas. Trimethylaluminum (TMA) gas can be used as the Al source raw material gas. Monosilane ($SiH_4$) gas can be used as the Si source raw material gas. Bis cyclopentadienyl magnesium ($Cp_2Mg$) gas can be used as the Mg source raw material gas.

Figure 2A:
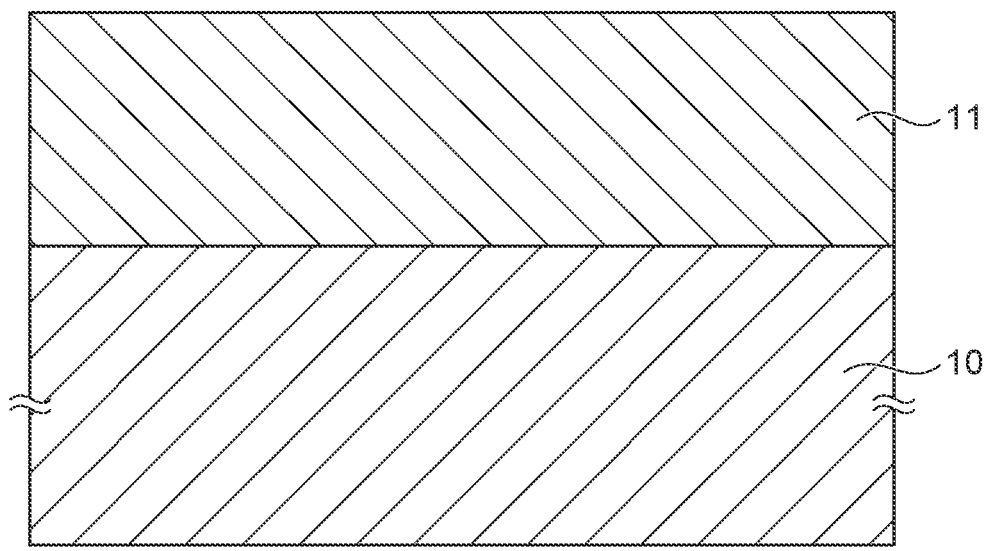
FIG. 2A to FIG. 2K are schematic cross-sectional views explaining a method for manufacturing the light-emitting element of the embodiment of the present disclosure.

First, as shown in FIG. 2A, the first nitride semiconductor layer 11 that includes an n-type impurity is formed on the substrate 10.

Figure 2B:
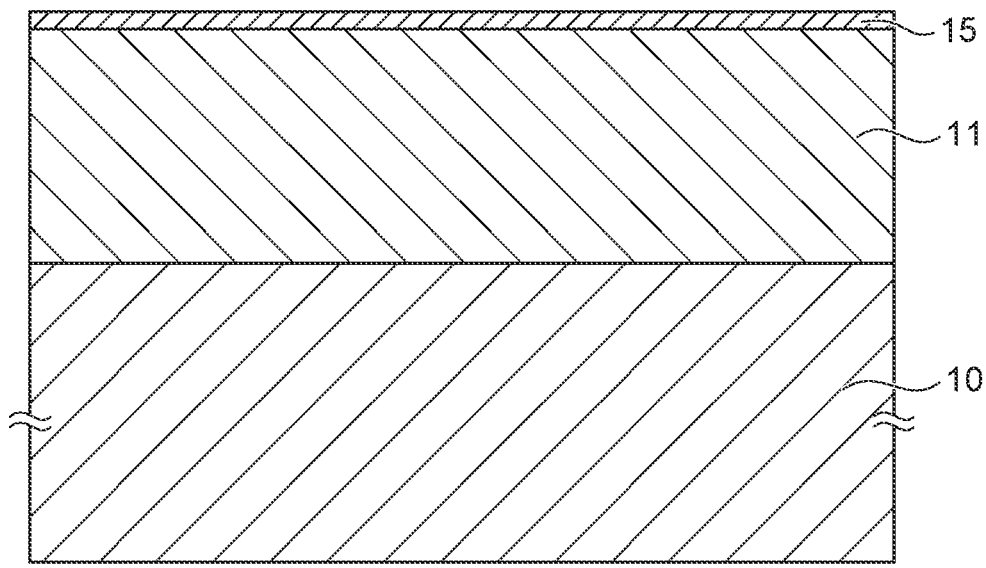

As shown in FIG. 2B, the first active layer 15 is formed on the first nitride semiconductor layer 11.

Figure 2C:
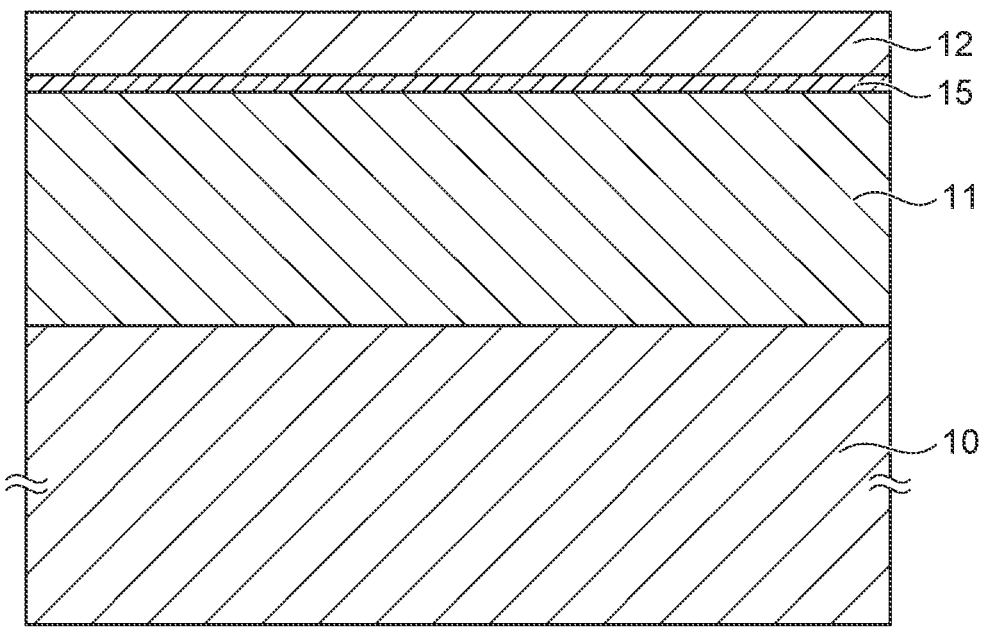

As shown in FIG. 2C, the second nitride semiconductor layer 12 that includes a p-type impurity is formed on the first active layer 15.

As shown in FIGS. 2D to 2G, the tunnel junction layer 20 that is made of a nitride semiconductor is formed on the second nitride semiconductor layer 12. The processes of forming the layers of the tunnel junction layer 20 are described below in detail.

Figure 2D:
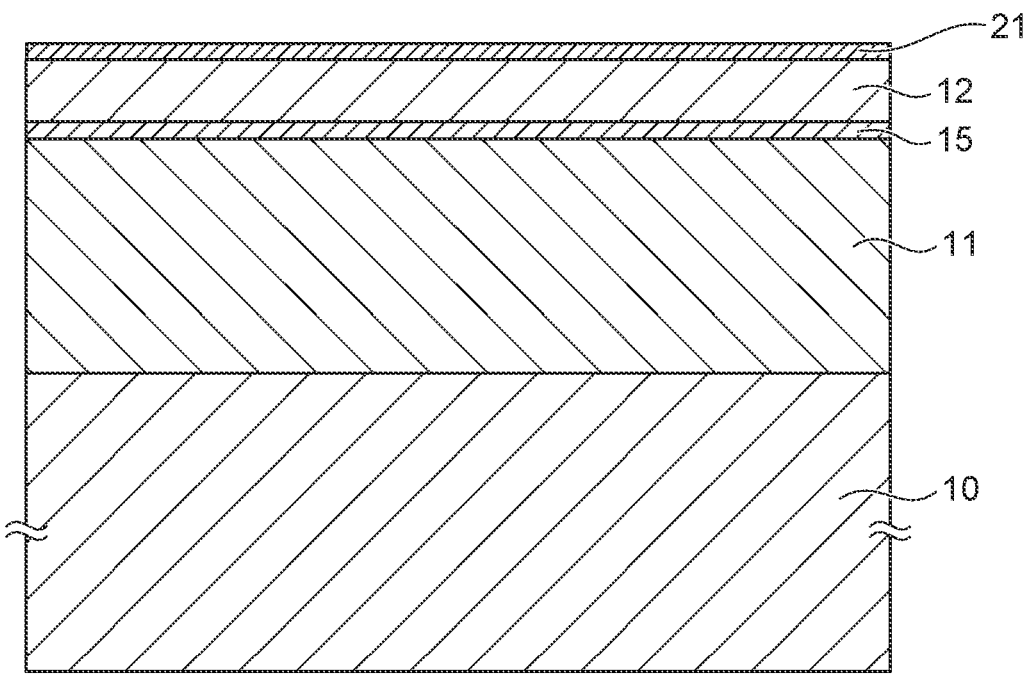
Figure 2E:
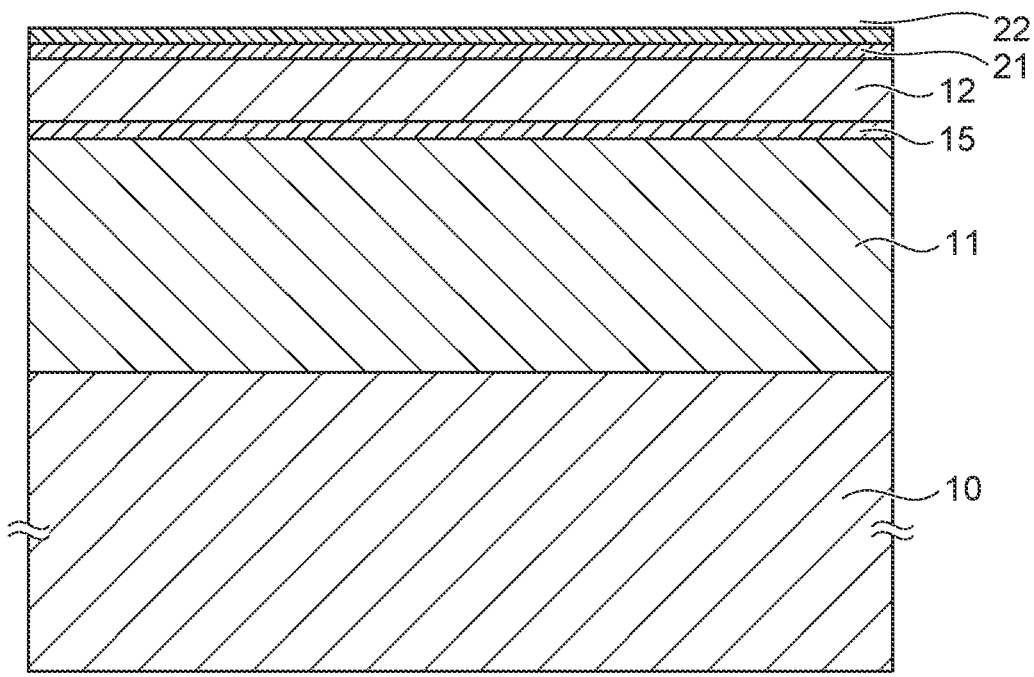
Figure 2F:
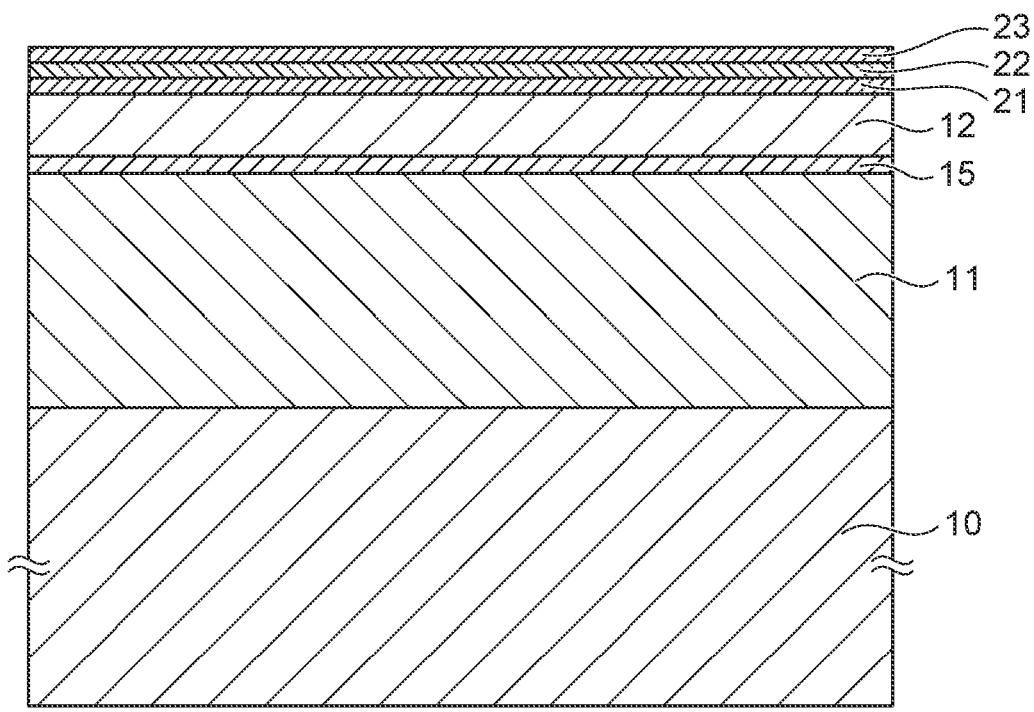
Figure 2G:
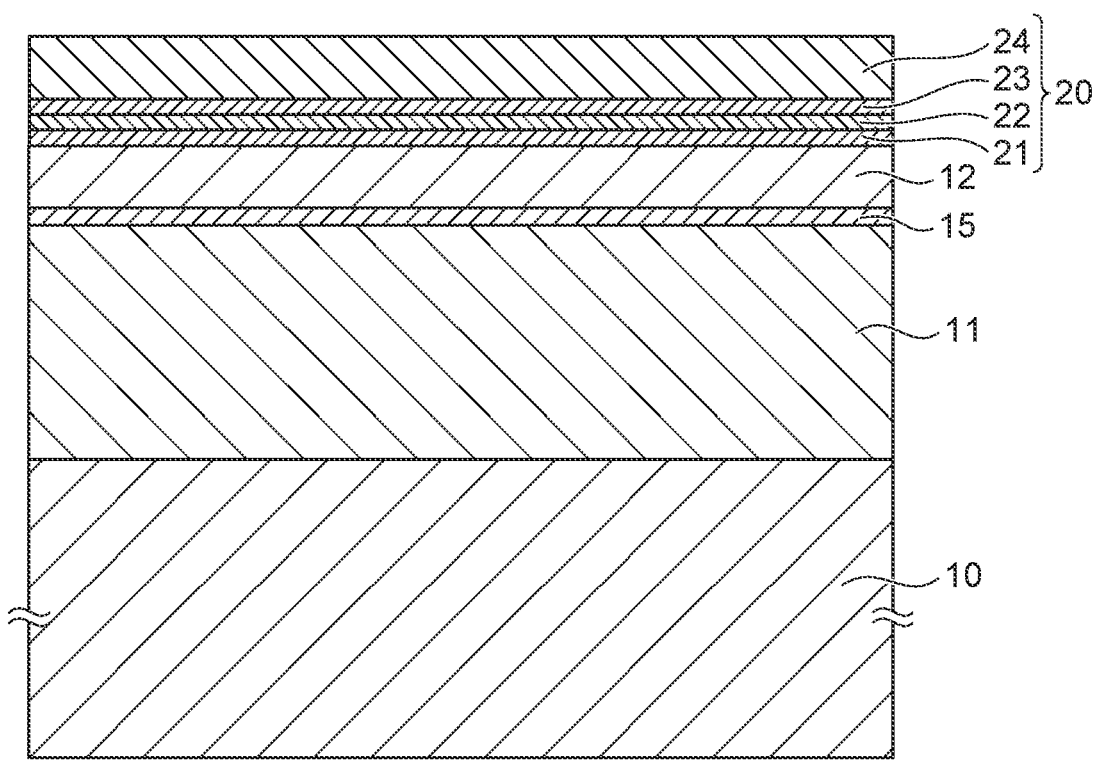
Figure 2H:
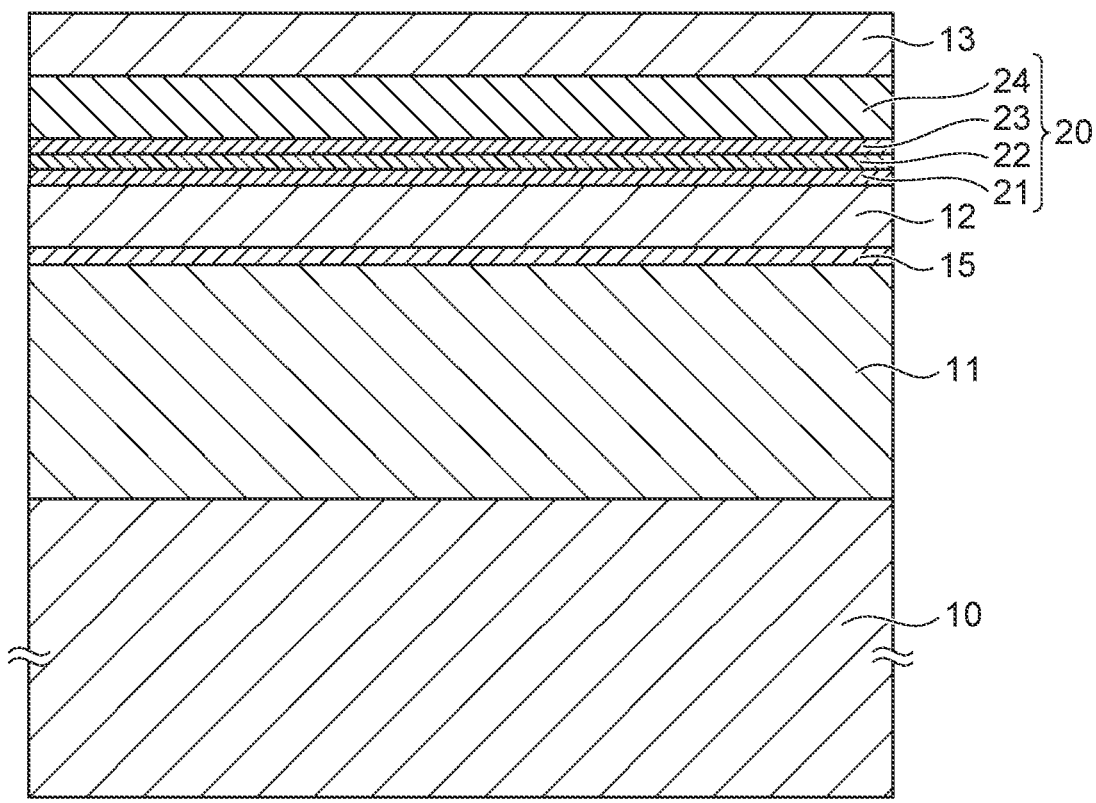

As shown in FIG. 2H, the third nitride semiconductor layer 13 is formed on the tunnel junction layer 20.

Figure 2I:
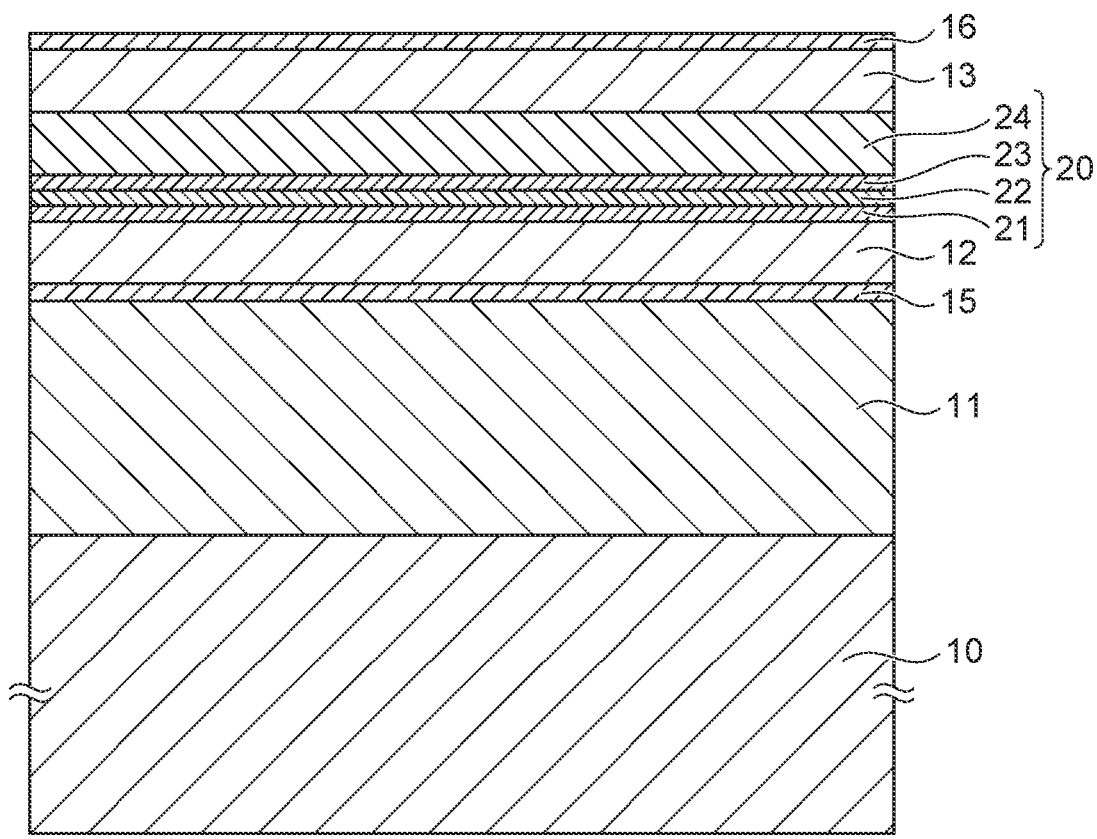

As shown in FIG. 2I, the second active layer 16 is formed on the third nitride semiconductor layer 13.

Figure 2J:
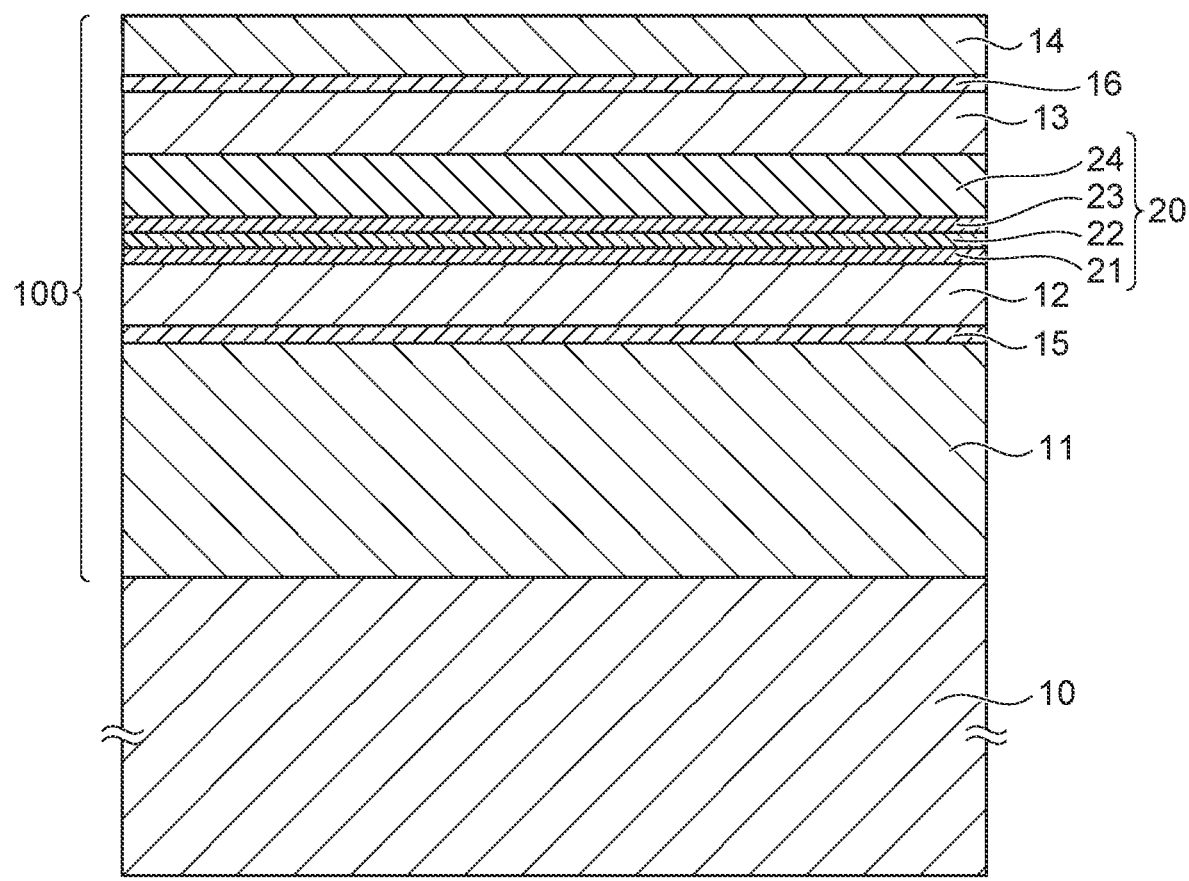

As shown in FIG. 2J, the fourth nitride semiconductor layer 14 is formed on the second active layer 16. Thus, the semiconductor structure body 100 is formed on the substrate 10.

Figure 2K:
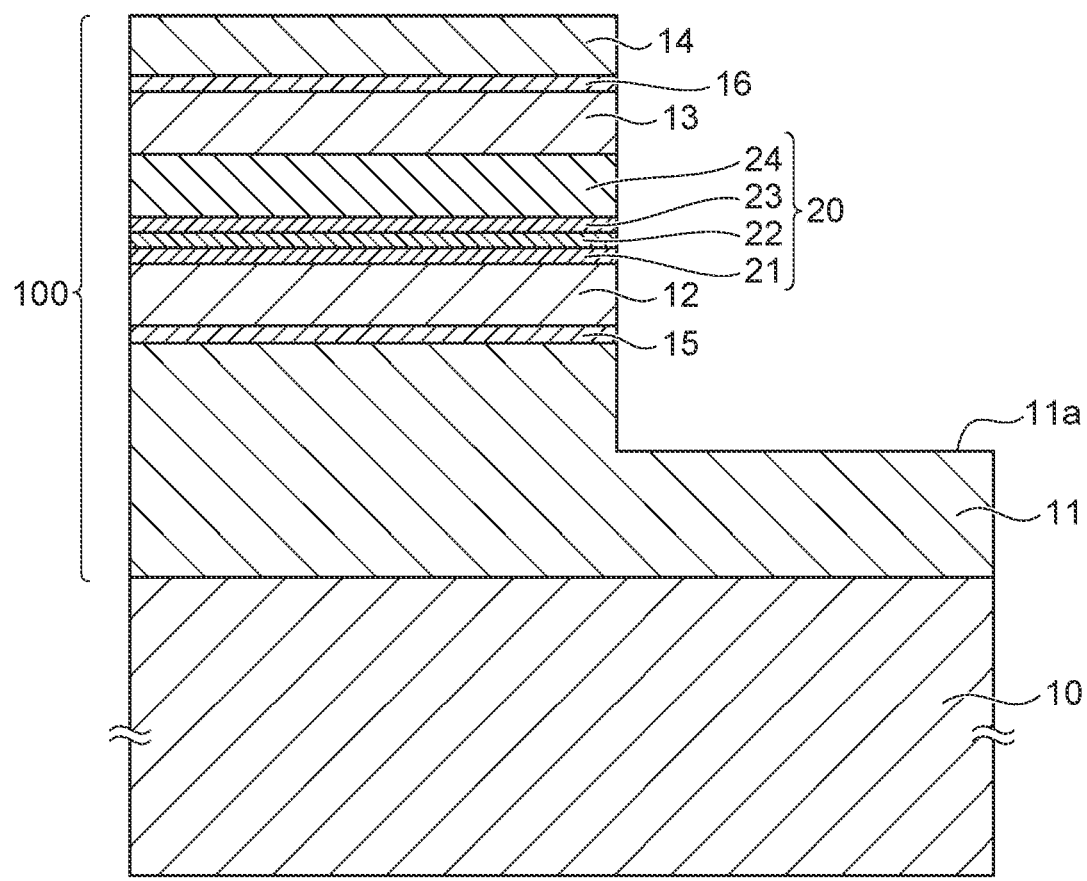

Subsequently, a portion of the semiconductor structure body 100 is removed. Thereby, as shown in FIG. 2K, a portion of the upper surface of the first nitride semiconductor layer 11 is exposed as the n-contact surface 11a.

Subsequently, as shown in FIG. 1, the p-side electrode 42 is formed on the upper surface of the fourth nitride semiconductor layer 14; and the n-side electrode 41 is formed on the n-contact surface 11a.

The process of forming the tunnel junction layer 20 will now be described.

The process of forming the tunnel junction layer 20 includes a process of forming the first n-type layer 21 on the second nitride semiconductor layer 12 as shown in FIG. 2D. The first n-type layer 21 is formed on the second nitride semiconductor layer 12 by introducing a third raw material gas that includes a third gas including an n-type impurity into a furnace at a third temperature. The third gas is $SiH_4$ gas that includes Si as the n-type impurity. It is favorable for the third temperature to be, for example, not less than 950° C. and not more than 1000° C.

The first n-type layer 21 forms a p-n junction with the p-type layer of the second nitride semiconductor layer 12. The first n-type layer 21 includes a high concentration of the n-type impurity (Si) to reduce the width of the depletion layer formed by the p-n junction and to make the tunneling of electrons easy. Therefore, to reduce the degradation of the crystallinity of the first n-type layer 21, it is favorable for the thickness of the first n-type layer 21 to be, for example, not more than 10 nm, and more favorably not less than 1 nm and not more than 3 nm. The n-type impurity concentration of the first n-type layer 21 is, for example, not less than $2 \times 10^{20}$ $cm^{-3}$ and not more than $1 \times 10^{21}$ $cm^{-3}$.

When the thickness of the first n-type layer 21 is low, the amount of the n-type impurity included in the tunnel junction layer 20 easily becomes insufficient, and it is difficult to reduce the width of the depletion layer formed by the p-n junction described above using only the first n-type layer 21. Therefore, an n-type layer that is thicker than the first n-type layer 21 and has a lower n-type impurity concentration than the first n-type layer 21 is formed on the first n-type layer 21. The n-type layer can increase the amount of the n-type impurity included in the tunnel junction layer 20 while reducing the degradation of the crystallinity of the tunnel junction layer 20. According to the embodiment, the second n-type layer 22 and the third n-type layer 23 are formed as the n-type layer on the first n-type layer 21. The second n-type layer 22 and the third n-type layer 23 are formed using different film formation conditions.

The process of forming the tunnel junction layer 20 includes a process of forming the second n-type layer 22 on the first n-type layer 21 as shown in FIG. 2E. The second n-type layer 22 is formed on the first n-type layer 21 by introducing a first raw material gas that includes a first gas including an n-type impurity at a first flow rate into a furnace at a first temperature. The first gas is, for example, $SiH_4$ gas that includes Si as the n-type impurity. The n-type impurity concentration of the second n-type layer 22 is less than the n-type impurity concentration of the first n-type layer 21. The n-type impurity concentration of the second n-type layer 22 is, for example, not less than $1 \times 10^{19}$ $cm^{-3}$ and not more than $2 \times 10^{20}$ $cm^{-3}$. The thickness of the second n-type layer 22 is greater than the thickness of the first n-type layer 21. The thickness of the second n-type layer 22 is greater than the thickness of the third n-type layer 23. The forward voltage of the light-emitting element 1 can be reduced thereby. For example, it is favorable for the thickness of the second n-type layer 22 to be not less than 10 nm, and more favorably not less than 10 nm and not more than 30 nm.

The process of forming the tunnel junction layer 20 further includes a process of forming the third n-type layer 23 on the second n-type layer 22 as shown in FIG. 2F. The third n-type layer 23 is formed on the second n-type layer 22 by introducing a second raw material gas that includes a second gas including an n-type impurity at a second flow rate into a furnace at a second temperature. The second gas is, for example, $SiH_4$ gas that includes the Si as the n-type impurity.

The second temperature when forming the third n-type layer 23 is less than the first temperature when forming the second n-type layer 22. For example, it is favorable for the first temperature to be not less than 950° C. and not more than 1000° C., and it is favorable for the second temperature to be not less than 900° C. and not more than 950° C.

The second nitride semiconductor layer 12 includes the p-type layer that includes Mg as the p-type impurity. There is a risk that the Mg included in the second nitride semiconductor layer 12 may move due to thermal diffusion from the second nitride semiconductor layer 12 into the tunnel junction layer 20 in the process of forming the tunnel junction layer 20 on the second nitride semiconductor layer 12.

According to the embodiment, the second temperature of the process of forming the third n-type layer 23 is less than the first temperature of the process of forming the second n-type layer 22 on the first n-type layer 21. Thereby, compared to when the second n-type layer 22 and the third n-type layer 23 are formed at the first temperature on the first n-type layer 21, the diffusion of the p-type impurity (Mg) from the second nitride semiconductor layer 12 into the tunnel junction layer 20 can be reduced. By reducing the diffusion of the p-type impurity (Mg) into the tunnel junction layer 20, the mixing of the p-type impurity (Mg) into the tunnel junction layer 20 can be reduced, and the electron carrier concentration can be increased. Therefore, the depletion layer that is formed by the tunnel junction layer 20 and the p-type layer of the second nitride semiconductor layer 12 can be narrow, and the forward voltage of the light-emitting element 1 can be reduced. Furthermore, by reducing the diffusion of the p-type impurity (Mg) into the tunnel junction layer 20, the diffusion of the p-type impurity (Mg) toward the second light-emitting part 52 in the process of forming the second light-emitting part 52 on the tunnel junction layer 20 can be reduced. As a result, the p-type impurity that enters the n-type layer included in the third nitride semiconductor layer 13 of the second light-emitting part 52, etc., can be reduced, and the forward voltage of the light-emitting element 1 can be reduced.

The second flow rate ratio of the second gas of the second raw material gas when forming the third n-type layer 23 is less than the first flow rate ratio of the first gas of the first raw material gas when forming the second n-type layer 22. Therefore, the n-type impurity concentration of the third n-type layer 23 is less than the n-type impurity concentration of the second n-type layer 22. It is favorable for the first flow rate to be, for example, not less than 4 sccm and not more than 8 sccm. It is favorable for the second flow rate to be, for example, not less than 0.4 sccm and not more than 4 sccm.

For example, the n-type impurity concentration formed by setting the flow rate of the $SiH_4$ gas to 8 sccm is about $1.5 \times 10^{20}$ $cm^{-3}$. For example, the n-type impurity concentration formed by setting the flow rate of the $SiH_4$ gas to 4 sccm is about $7.5 \times 10^{19}$ $cm^{-3}$. For example, the n-type impurity concentration formed by setting the flow rate of the $SiH_4$ gas to 0.4 sccm is about $7.5 \times 10^{18}$ $cm^{-3}$.

Because the third n-type layer 23 is formed at a lower temperature than the second n-type layer 22, there is a risk that the crystallinity may degrade. According to the embodiment, the degradation of the crystallinity of the third n-type layer 23 can be reduced by setting the n-type impurity concentration of the third n-type layer 23 to be less than the n-type impurity concentration of the second n-type layer 22. The forward voltage of the light-emitting element 1 can be reduced thereby. The n-type impurity concentration of the third n-type layer 23 is, for example, not less than $5 \times 10^{18}$ $cm^{-3}$ and not more than $1 \times 10^{20}$ $cm^{-3}$.

The process of forming the tunnel junction layer 20 further includes a process of forming the fourth n-type layer 24 on the third n-type layer 23 as shown in FIG. 2G. The fourth n-type layer 24 is formed on the third n-type layer 23 by introducing a fourth raw material gas that includes a fourth gas including an n-type impurity into a furnace at a fourth temperature. The fourth gas is, for example, $SiH_4$ gas that includes Si as the n-type impurity. The n-type impurity concentration of the fourth n-type layer 24 is less than the n-type impurity concentration of the third n-type layer 23. The thickness of the fourth n-type layer 24 is greater than the thickness of the third n-type layer 23. The thickness of the fourth n-type layer 24 is greater than the total thickness of the first n-type layer 21, the second n-type layer 22, and the third n-type layer 23. It is favorable for the thickness of the fourth n-type layer 24 to be, for example, not less than 50 nm and not more than 150 nm. The fourth temperature when forming the fourth n-type layer 24 is less than the first temperature when forming the second n-type layer 22. It is favorable for the fourth temperature to be, for example, not less than 900° C. and not more than 950° C. The n-type impurity concentration of the fourth n-type layer 24 is, for example, not less than $1 \times 10^{18}$ $cm^{-3}$ and not more than $2 \times 10^{19}$ $cm^{-3}$.

The stacked part that includes the first n-type layer 21, the second n-type layer 22, and the third n-type layer 23 includes a high concentration of the n-type impurity to reduce the width of the depletion layer formed by the p-n junction described above. It is therefore easier for the crystallinity of the stacked part to degrade and the flatness of the upper surface of the third n-type layer 23 to degrade. When the flatness of the upper surface of the third n-type layer 23 degrades, there is a risk that the crystallinity of the semiconductor layer formed on the third n-type layer 23 may degrade.

According to the embodiment, the fourth n-type layer 24 is formed on the third n-type layer 23, and is thicker and has a lower n-type impurity concentration than the stacked part including the first n-type layer 21, the second n-type layer 22, and the third n-type layer 23. Thereby, the upper surface of the fourth n-type layer 24 that is used as the upper surface of the tunnel junction layer 20 can be nearly flat, and the second light-emitting part 52 can be formed to have good crystallinity on the tunnel junction layer 20.

According to other embodiments of the present disclosure as well, the total of the thickness of the second n-type layer 22 and the thickness of the third n-type layer 23 is set to be not more than 50 nm; the thickness of the third n-type layer 23 is set to be not less than 40% and not more than 80% of the total of the thickness of the second n-type layer 22 and the thickness of the third n-type layer 23. The difference between the first temperature when forming the second n-type layer 22 and the second temperature when forming the third n-type layer 23 is set to be not more than 100° C. The forward voltage of the light-emitting element 1 can be reduced thereby.

The results of making samples of the light-emitting element and measuring a forward voltage Vf and an output Po of each sample will now be described.

Figure 3:
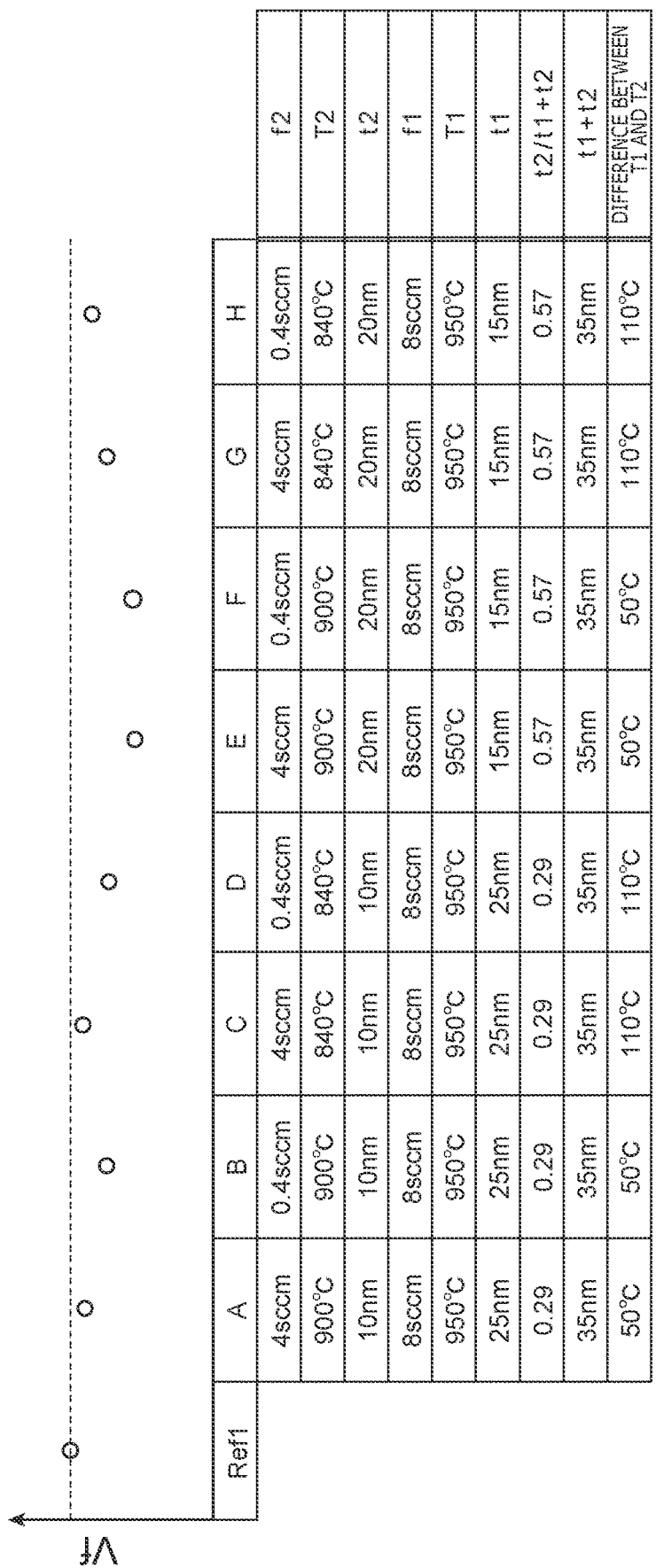
FIG. 3 is a graph showing measurement results of forward voltages Vf of samples of light-emitting elements.

FIG. 3 is a graph showing the measurement results of the forward voltage Vf of Samples Ref1 and A to H. In the vertical axis of FIG. 3, Vf increases upward. In FIG. 3, the level of Vf of Sample Ref1 is shown by a broken line.

Figure 4:
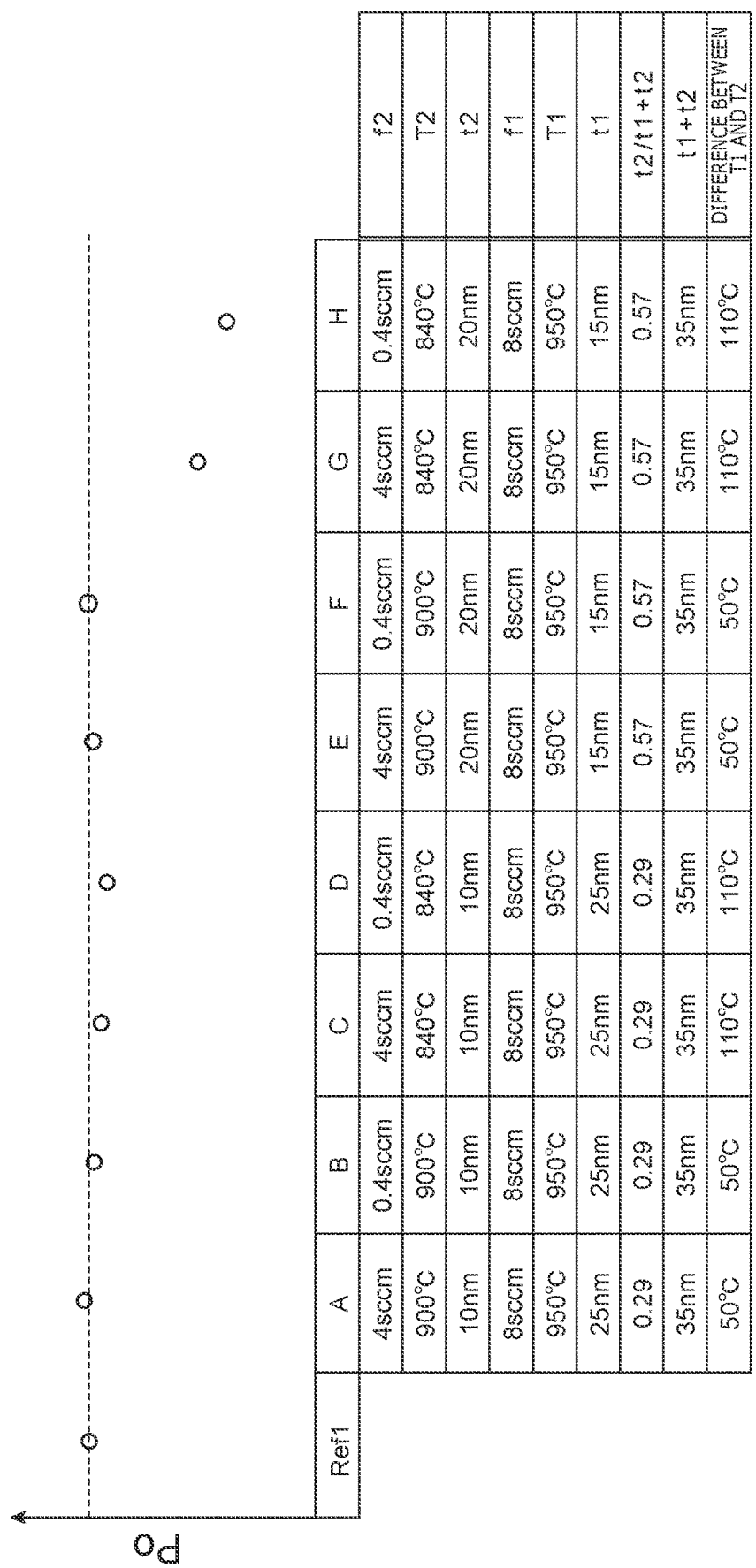
FIG. 4 is a graph showing measurement results of outputs Po of samples of light-emitting elements.

FIG. 4 is a graph showing the measurement results of the output Po of Samples Ref1 and A to H. In the vertical axis of FIG. 4, Po increases upward. In FIG. 4, the level of Po of Sample Ref1 is shown by a broken line.

Sample Ref1 was a sample in which the first light-emitting part 51, the tunnel junction layer 20, and the second light-emitting part 52 were formed in this order on the substrate 10 made of sapphire.

In Sample Ref1, an n-type layer that had a thickness of 35 nm was formed as an n-type layer between the first n-type layer 21 and the fourth n-type layer 24 of the tunnel junction layer 20 by using a flow rate of $SiH_4$ gas of 8 sccm and a temperature of 950° C.

In Samples A to H, the n-type layer between the first n-type layer 21 and the fourth n-type layer 24 of the tunnel junction layer 20 was formed by forming the second n-type layer 22 on the first n-type layer 21 and by forming the third n-type layer 23 on the second n-type layer 22. Samples A to H were formed using the same conditions as Sample Ref1 other than the different conditions used when forming the second n-type layer 22 and the third n-type layer 23 between the first n-type layer 21 and the fourth n-type layer 24 of the tunnel junction layer 20.

In FIG. 3, FIG. 4, and FIGS. 5 to 6 described below, f2 is the second flow rate of the $SiH_4$ gas when forming the third n-type layer 23. T2 is the second temperature when forming the third n-type layer 23. t2 is the thickness of the third n-type layer 23. f1 is the first flow rate of the $SiH_4$ gas when forming the second n-type layer 22. T1 is the first temperature when forming the second n-type layer 22. t1 is the thickness of the second n-type layer 22. t1+t2 is the sum of the thickness t1 of the second n-type layer 22 and the thickness t2 of the third n-type layer 23. t2/t1+t2 is the ratio of the thickness t2 of the third n-type layer 23 to the sum t1+t2 of the second and third n-type layers 22 and 23.

For each of Samples Ref1 and A to H, Vf was measured at five different locations on the wafer; and the average of the five Vf measurements is shown by a white circle in FIG. 3. Also, for each of Samples Ref1 and A to H, Po was measured at four different locations on the wafer; and the average of the four Po measurements is shown by a white circle in FIG. 4. The values of Vf and Po were values when the forward current was set to 120 mA.

The results of FIG. 3 show that Vf for Samples A to H in which f1 was greater than f2, T1 was greater than T2, and t1+t2 was not more than 50 nm was less than Vf of Sample Ref1.

The results of FIG. 4 show that Po for Samples A to F was about equal to Po of Sample Ref1. Po for Samples G and H was less than Po of Sample Ref1. Accordingly, to relax the decrease of Po, it is favorable for the difference between T1 and T2 to be not more than 100° C.

Figure 5:
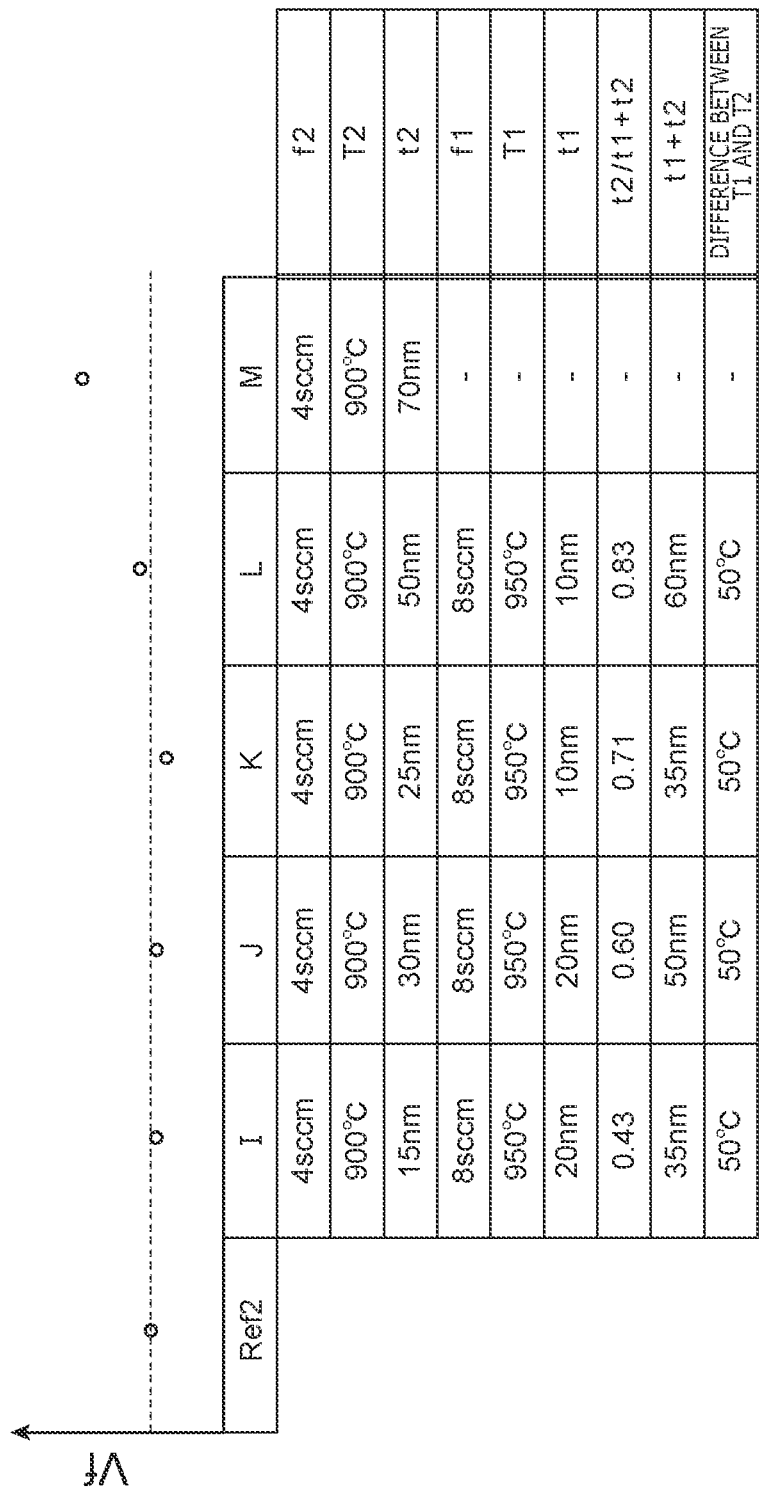
FIG. 5 is a graph showing measurement results of forward voltages Vf of samples of light-emitting elements.

FIG. 5 is a graph showing the measurement results of the forward voltage Vf of Samples Ref2 and I to M. In the vertical axis of FIG. 5, Vf increases upward. In FIG. 5, the level of Vf of Sample Ref2 is shown by a broken line.

Similarly to Sample Ref1, Sample Ref2 was a sample in which the first light-emitting part 51, the tunnel junction layer 20, and the second light-emitting part 52 were formed in this order on the substrate 10 made of sapphire.

In Sample Ref2, an n-type layer that had a thickness of 35 nm was formed as the n-type layer between the first n-type layer 21 and the fourth n-type layer 24 of the tunnel junction layer 20 by using a flow rate of $SiH_4$ gas of 8 sccm and a temperature of 950° C.

In Samples I to L, the n-type layer between the first n-type layer 21 and the fourth n-type layer 24 of the tunnel junction layer 20 was formed by forming the second n-type layer 22 on the first n-type layer 21 and by forming the third n-type layer 23 on the second n-type layer 22. In Sample M, only the third n-type layer 23 was formed as the n-type layer between the first n-type layer 21 and the fourth n-type layer 24 of the tunnel junction layer 20; and the second n-type layer 22 was not formed. Samples I to M were formed using the same conditions as Sample Ref2 other than the different conditions used when forming the second n-type layer 22 and/or the third n-type layer 23 between the first n-type layer 21 and the fourth n-type layer 24 of the tunnel junction layer 20.

For each of Samples Ref2 and I to M, Vf was measured at five different locations on the wafer, and the average of the five Vf measurements is shown by a white circle in FIG. 5. The value of Vf was a value when the forward current was set to 120 mA.

The results of FIG. 5 show that Vf for Samples I to K in which f1 was greater than f2, T1 was greater than T2, t2/t1+t2 was not less than 40% and not more than 80%, and t1+t2 was not more than 50 nm was less than Vf of Sample Ref2. Po for Samples I to M was about equal to Po of Sample Ref2.

Figure 6:
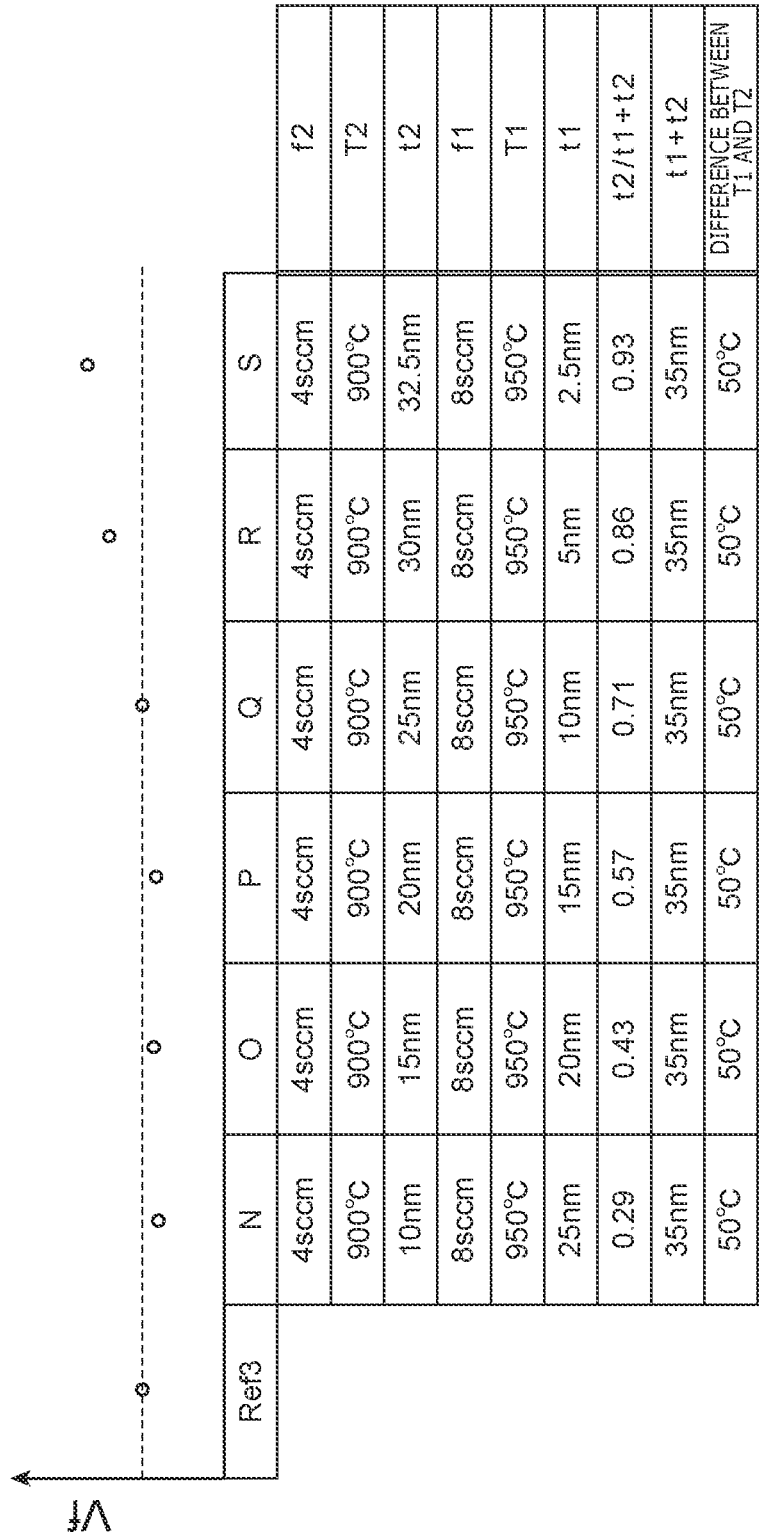
FIG. 6 is a graph showing measurement results of forward voltages Vf of samples of light-emitting elements.

FIG. 6 is a graph showing the measurement results of the forward voltage Vf for Samples Ref3 and N to S. In the vertical axis of FIG. 6, Vf increases upward. In FIG. 6, the level of Vf of Sample Ref3 is shown by a broken line.

Similarly to Sample Ref1, Sample Ref3 was a sample in which the first light-emitting part 51, the tunnel junction layer 20, and the second light-emitting part 52 were formed in this order on the substrate 10 made of sapphire.

In Sample Ref3, an n-type layer that had a thickness of 35 nm was formed as the n-type layer between the first n-type layer 21 and the fourth n-type layer 24 of the tunnel junction layer 20 by using a flow rate of $SiH_4$ gas of 8 sccm and a temperature of 950° C.

In Samples N to S, the n-type layer between the first n-type layer 21 and the fourth n-type layer 24 of the tunnel junction layer 20 was formed by forming the second n-type layer 22 on the first n-type layer 21 and by forming the third n-type layer 23 on the second n-type layer 22. Samples N to S were formed using the same conditions as Sample Ref3 other than the different conditions used when forming the second n-type layer 22 and the third n-type layer 23 between the first n-type layer 21 and the fourth n-type layer 24 of the tunnel junction layer 20.

For each of Samples Ref3 and N to S, Vf was measured at five different locations on the wafer; and the average of the five Vf measurements is shown by a white circle in FIG. 6. The value of Vf was a value when the forward current was set to 120 mA.

The results of FIG. 6 show that Vf for Samples N to Q in which f1 was greater than f2, T1 was greater than T2, and t1+t2 was not more than 50 nm was less than Vf of Sample Ref3. Also, Po for Samples N to S was about equal to Po of Sample Ref3.

Among Samples A to H that are compared to Sample Ref1, for Samples E and F in particular, Vf was less than those of the other samples while maintaining about the same Po as Sample Ref1. Vf of Sample E was 0.15 V less than Vf of Sample Ref1. Vf of Sample F was 0.15 V less than Vf of Sample Ref1.

Among Samples I to M that are compared to Sample Ref2, for Sample K in particular, Vf was less than those of the other samples while maintaining about the same Po as Sample Ref2. Vf of Sample K was 0.07 V less than Vf of Sample Ref2.

Among Samples N to S that are compared to Sample Ref3, for Samples N and P in particular, Vf was less than those of the other samples while maintaining about the same Po as Sample Ref3. Vf of Sample N was 0.05 V less than Vf of Sample Ref3. Vf of Sample P was 0.04 V less than Vf of Sample Ref3.

The results of FIGS. 3 to 6 show that it is favorable for t2/t1+t2 to be not less than 40% and not more than 80% to reduce Vf while relaxing the decrease of Po. For Samples A to D and N, even when t2/t1+t2 was less than 40%, Vf could be reduced while relaxing the decrease of Po by setting t1 to be greater than t2.

Embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Further, within the scope of the spirit of the present invention, one skilled in the art can conceive various modifications, and the modifications fall within the scope of the present invention.

What is claimed is:

1. A method for manufacturing a light-emitting element, the method comprising:
    forming a first nitride semiconductor layer including an n-type impurity;
    forming a first active layer on the first nitride semiconductor layer;
    forming a second nitride semiconductor layer on the first active layer, the second nitride semiconductor layer including a p-type impurity;
    forming a tunnel junction layer on the second nitride semiconductor layer, the tunnel junction layer including a nitride semiconductor layer;
    forming a third nitride semiconductor layer on the tunnel junction layer, the third nitride semiconductor layer including an n-type impurity;
    forming a second active layer on the third nitride semiconductor layer; and
    forming a fourth nitride semiconductor layer on the second active layer, the fourth nitride semiconductor layer including a p-type impurity;
    wherein:
    the step of forming the tunnel junction layer comprises:
        forming a first n-type layer,
        forming a second n-type layer on the first n-type layer by introducing a first raw material gas into a furnace at a first temperature, the first raw material gas including a first gas that includes an n-type impurity and has a first flow rate, the second n-type layer having a lower n-type impurity concentration than the first n-type layer, and
        forming a third n-type layer on the second n-type layer by introducing a second raw material gas into a furnace at a second temperature, the second raw material gas including a second gas that includes an n-type impurity and has a second flow rate, the second temperature being less than the first temperature, the third n-type layer having a lower n-type impurity concentration than the second n-type layer;
    a first flow rate ratio of the first gas in the first raw material gas is greater than a second flow rate ratio of the second gas in the second raw material gas; and
    a thickness of the second n-type layer is greater than a thickness of the third n-type layer.

2. The method according to claim 1, wherein:
    the second n-type layer is formed to be thicker than the first n-type layer.

3. The method according to claim 1, wherein:
    the first temperature is not less than 950° C. and not more than 1000° C.; and
    the second temperature is not less than 900° C. and not more than 950° C.

4. The method according to claim 1, wherein:
    the n-type impurity concentration of the second n-type layer is not less than $1\times10^{19}$ cm$^{-3}$ and not more than $2\times10^{20}$ cm$^{-3}$; and
    the n-type impurity concentration of the third n-type layer is not less than $5\times10^{18}$ cm$^{-3}$ and not more than $1\times10^{20}$ cm$^{-3}$.

5. The method according to claim 1, wherein:
    the thickness of the second n-type layer is not less than 10 nm.

6. The method according to claim 2, wherein:
    the thickness of the second n-type layer is not less than 10 nm.

7. The method according to claim 1, wherein:
    the step of forming of the tunnel junction layer further comprises forming a fourth n-type layer on the third n-type layer; and
    the fourth n-type layer has a lower n-type impurity concentration than the third n-type layer.

8. The method according to claim 2, wherein:
    the step of forming of the tunnel junction layer further comprises forming a fourth n-type layer on the third n-type layer; and
    the fourth n-type layer has a lower n-type impurity concentration than the third n-type layer.

9. The method according to claim 6, wherein:
    the step of forming of the tunnel junction layer further comprises forming a fourth n-type layer on the third n-type layer; and
    the fourth n-type layer has a lower n-type impurity concentration than the third n-type layer.

10. The method according to claim 1, wherein:
    the first gas and the second gas are SiH$_4$ gas.

11. A method for manufacturing a light-emitting element, the method comprising:
    forming a first nitride semiconductor layer including an n-type impurity;
    forming a first active layer on the first nitride semiconductor layer;
    forming a second nitride semiconductor layer on the first active layer, the second nitride semiconductor layer including a p-type impurity;
    forming a tunnel junction layer on the second nitride semiconductor layer, the tunnel junction layer including a nitride semiconductor layer;
    forming a third nitride semiconductor layer on the tunnel junction layer, the third nitride semiconductor layer including an n-type impurity;
    forming a second active layer on the third nitride semiconductor layer; and
    forming a fourth nitride semiconductor layer on the second active layer, the fourth nitride semiconductor layer including a p-type impurity;
    wherein:
    the step of forming the tunnel junction layer comprises:
        forming a first n-type layer,
        forming a second n-type layer on the first n-type layer by introducing a first raw material gas into a furnace at a first temperature, the first raw material gas including a first gas that includes an n-type impurity and has a first flow rate, the second n-type layer having a lower n-type impurity concentration than the first n-type layer, and
        forming a third n-type layer on the second n-type layer by introducing a second raw material gas into a furnace at a second temperature, the second raw material gas including a second gas that includes an n-type impurity and has a second flow rate, the second temperature being less than the first temperature, the third n-type layer having a lower n-type impurity concentration than the second n-type layer;
    a first flow rate ratio of the first gas in the first raw material gas is greater than a second flow rate ratio of the second gas in the second raw material gas;

a sum of a thickness of the second n-type layer and a thickness of the third n-type layer is not more than 50 nm;

the thickness of the third n-type layer is not less than 40% and not more than 80% of the sum of the thickness of the second n-type layer and the thickness of the third n-type layer; and a difference between the first temperature and the second temperature is not more than 100° C.

12. The method according to claim 11, wherein:

the second n-type layer is formed to be thicker than the first n-type layer.

13. The method according to claim 11, wherein:

the first temperature is not less than 950° C. and not more than 1000° C.; and the second temperature is not less than 900° C. and not more than 950° C.

14. The method according to claim 11, wherein:

the n-type impurity concentration of the second n-type layer is not less than $1 \times 10^{19}$ cm$^{-3}$ and not more than $2 \times 10^{20}$ cm$^{-3}$; and the n-type impurity concentration of the third n-type layer is not less than $5 \times 10^{18}$ cm$^{-3}$ and not more than $1 \times 10^{20}$ cm$^{-3}$.

15. The method according to claim 11, wherein:

the thickness of the second n-type layer is not less than 10 nm.

16. The method according to claim 12, wherein:

the thickness of the second n-type layer is not less than 10 nm.

17. The method according to claim 11, wherein:

the step of forming of the tunnel junction layer further includes forming a fourth n-type layer on the third n-type layer; and the fourth n-type layer has a lower n-type impurity concentration than the third n-type layer.

18. The method according to claim 12, wherein:

the step of forming of the tunnel junction layer further includes forming a fourth n-type layer on the third n-type layer; and the fourth n-type layer has a lower n-type impurity concentration than the third n-type layer.

19. The method according to claim 16, wherein:

the step of forming of the tunnel junction layer further includes forming a fourth n-type layer on the third n-type layer; and the fourth n-type layer has a lower n-type impurity concentration than the third n-type layer.

20. The method according to claim 11, wherein:

the first gas and the second gas are SiH$_4$ gas.

* * * * *